(12) United States Patent
Bhargava et al.

(10) Patent No.: US 9,875,815 B1
(45) Date of Patent: Jan. 23, 2018

(54) FAST MEMORY ARRAY REPAIR USING LOCAL CORRELATED ELECTRON SWITCH (CES) MEMORY CELLS

(71) Applicant: ARM LTD, Cambridge (GB)

(72) Inventors: Mudit Bhargava, Austin, TX (US); Joel Thornton Irby, Austin, TX (US)

(73) Assignee: ARM LTD, Cambridge (GB)

( * ) Notice: Subject to any disclaimer, the term of this patent is extended or adjusted under 35 U.S.C. 154(b) by 0 days.

(21) Appl. No.: 15/682,958

(22) Filed: Aug. 22, 2017

Related U.S. Application Data

(63) Continuation of application No. 15/381,415, filed on Dec. 16, 2016, now Pat. No. 9,767,924.

(51) Int. Cl.
*G11C 29/26* (2006.01)
*G11C 29/00* (2006.01)
*G11C 8/10* (2006.01)

(52) U.S. Cl.
CPC .............. *G11C 29/76* (2013.01); *G11C 8/10* (2013.01)

(58) Field of Classification Search
CPC ..... G11C 29/4401; G11C 29/44; G11C 29/38; G11C 16/08; G11C 29/785
See application file for complete search history.

(56) References Cited

U.S. PATENT DOCUMENTS

| 5,841,712 A * | 11/1998 | Wendell ................. G11C 7/065 365/185.09 |
| 9,508,456 B1 * | 11/2016 | Shim ..................... G11C 29/78 |
| 2002/0108073 A1 * | 8/2002 | Hughes ................. G11C 29/44 714/6.32 |
| 2009/0097342 A1 * | 4/2009 | Tseng ................... G11C 29/808 365/201 |
| 2017/0045905 A1 | 2/2017 | Sandhu et al. |
| 2017/0047919 A1 | 2/2017 | Sandhu et al. |

* cited by examiner

*Primary Examiner* — Tuan T Nguyen
(74) *Attorney, Agent, or Firm* — Leveque IP Law, P.C.

(57) ABSTRACT

An integrated circuit is provided for self-repair of a memory array. The circuit includes first word lines coupled to first memory rows of the memory array, one first word line for each bit of a line address word, second word lines coupled to one or more spare memory rows of the memory array. Repair configuration data is stored in memory cells within the integrated circuit to direct memory accesses to spare memory rows rather than dysfunctional first memory rows. A memory cell may be based on a correlated electron switch (CES). A built-in self-test circuit is provided to facilitate setting of repair configuration data. The repair data may be reconfigurable, enabling operating margins to be improved by testing under various operating conditions.

20 Claims, 4 Drawing Sheets

US 9,875,815 B1

FAST MEMORY ARRAY REPAIR USING LOCAL CORRELATED ELECTRON SWITCH (CES) MEMORY CELLS

PRIORITY CLAIM

This application is a continuation of U.S. patent application Ser. No. 15/381,415 filed on Dec. 16, 2016 which is hereby incorporated herein by reference.

TECHNICAL FIELD

The present disclosure relates the repair of an electronic memory array using redundant array rows.

BACKGROUND

Integrated circuit electronic memory arrays may be manufactured with spare rows. After testing, these rows may be used to replace rows with one or more faulty memory cells and restore the functionality of the array. A record of faulty rows may be maintained in an off-chip memory. Retrieval of the record prior to operation of the memory incurs timing and power overhead during boot-up. Additional overhead is needed to route repair addresses into the address decoder.

Correlated Electron Material (CEM) exhibits an abrupt transition from a conductive/low impedance state to an insulative/high impedance state, the transition arising from electron correlations in a material, rather than from solid state structural phase changes and may form a switch. The switch may form the basis of a memory cell.

DETAILED DESCRIPTION OF THE EMBODIMENTS

Figure 1:
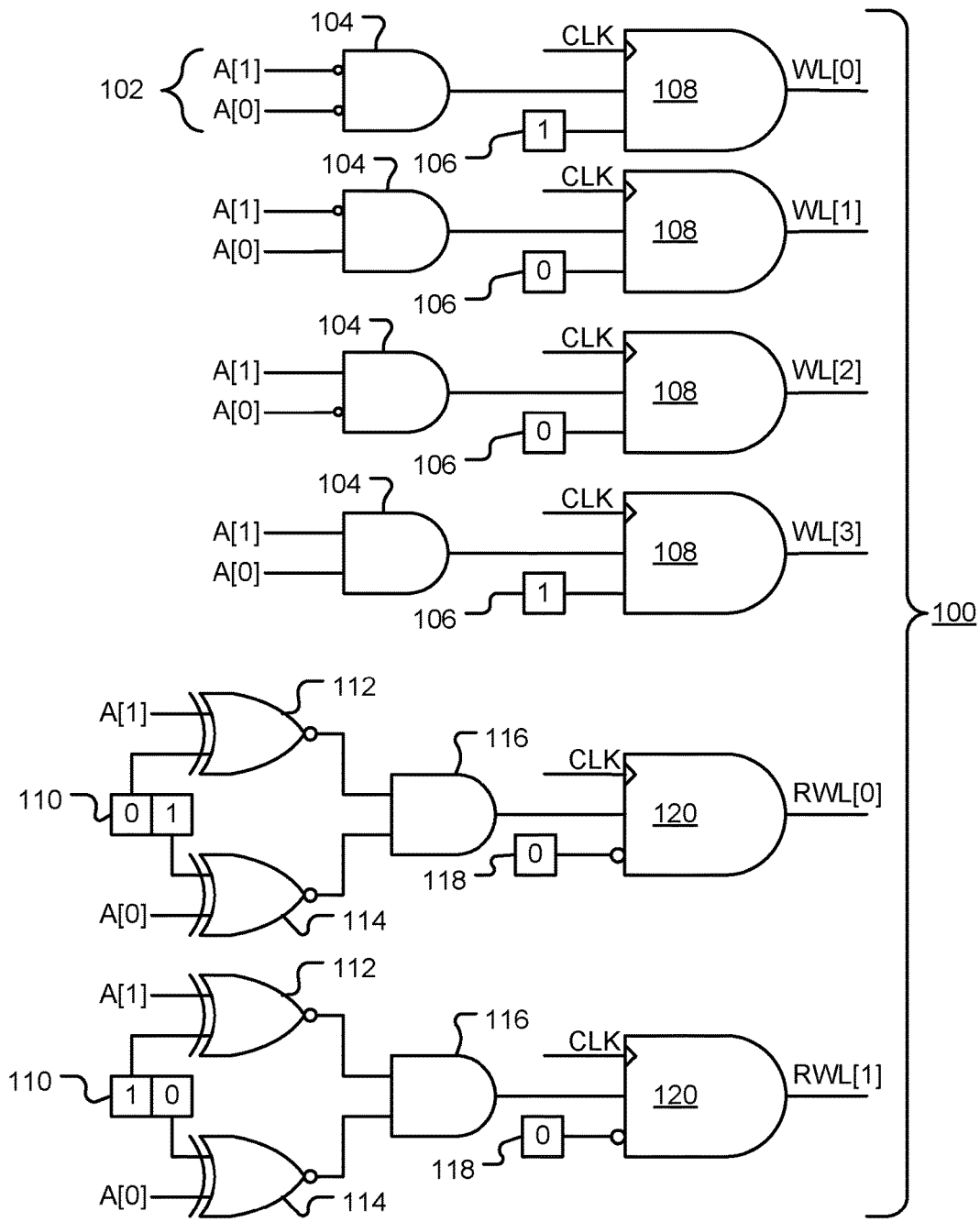
FIG. 1 shows a circuit diagram of a word line decoder, in accordance with embodiments of the disclosure.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

The present disclosure relates to a circuit for decreasing the timing and routing overhead required to swap redundant rows for defective rows in a semiconductor array. The speed-up is achieved by storing the repair data locally in non-volatile memory such as a memory based on a Correlated Electron Switch (CES). A Correlated Electron Switch (CES) utilizes Correlated Electron Material (CEM) that exhibits an abrupt transition from a conductive/low impedance state to an insulative/high impedance state, the transition arising from electron correlations in a material. Moreover, the disclosure is applicable to other memory structures, including Flash, DRAM, MRAM, and ReRAM, to list just a few.

Functionality of a semiconductor memory array may be retained in the presence of failed memory cells by providing additional, redundant rows in the array. When a failure is detected in a row, the functionality of that row is replaced by one of the redundant rows. In this way, a certain number of row failures may be tolerated before the whole array must be discarded.

Traditionally, array repair configuration information is stored in fuses, often in a central location far from the embedded, repairable arrays. This necessitates the loading of repair registers near the repairable arrays on power-up, typically using a serial shift register. The array repair configuration information includes indicators of failed rows and indicators of which row a spare row replaces.

In accordance with a feature of the present disclosure, the loading of repair data may be eliminated by using CES storage elements located alongside the array rows themselves. In one embodiment, the repair data is stored in the address decoder and the word-line generator logic. This reduces the timing overhead of a write or read operation, while also reducing routing congestion in the decoder, since the repair address no longer factors into the word-line decode operation.

A CES device may comprise CEM sandwiched between conductive terminals to form a variable impeder device. As utilized herein, the terms "correlated electron switch" and "variable impeder" may be interchangeable. At least in part through application of a critical voltage and a critical current between the terminals, the CEM may transition between the aforementioned conductive/lower impedance state and insulative/higher impedance state. As mentioned, CEM in a variable impeder device may transition between a first impedance state and a second impedance state due to a quantum mechanical transition of the correlated electron switch material as a result an applied critical voltage and an applied critical current, as described in more detail below. Also, as mentioned above, a variable impeder device may exhibit properties of both variable resistance and variable capacitance.

In a particular embodiment, a variable impeder device, such as a CES device, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. An impedance state of a CES device may be detected based, at least in part, on a signal detected on terminals of the CES device in a read and/or sense operation. In another particular embodiment, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

An example CES/variable impeder device may comprise characteristics of both variable resistance and variable capacitance. While a variable impeder device may comprise a substantially homogenous CEM an equivalent circuit for a variable impeder device may comprise a variable resistor in parallel with a variable capacitor.

TABLE 1 below depicts an example truth table for an example variable impeder device, such as a CES device.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

A resistance of a variable impeder device may transition between a lower resistance state and a higher resistance state that is a function, at least in part, of a voltage $V_{applied}$ applied across the CEM. A resistance of a lower resistance state may be 10-100,000 times lower than a resistance of a higher resistance state, although claimed subject matter is not limited in scope in this respect. Similarly, a capacitance of a variable impeder device may transition between a lower capacitance state, which for an example embodiment may comprise approximately zero, or very little, capacitance, and a higher capacitance state that is a function, at least in part, of a voltage applied across the CEM. Also, as seen in TABLE 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

FIG. 1 shows a circuit diagram of address decoder and word-line generator logic 100 in accordance with embodiments of the disclosure. In the example circuit shown in FIG. 1, there are four word lines, denoted as WL[0], WL[1], WL[2] and WL[3], one for each of the four rows of an array. In addition, there are with extra two word lines, denoted as RWL[0] and RWL[1], one for each of the two spare or redundant rows of the array.

In the embodiment shown, each word line receives a memory address on address lines 102. The address is decoded in decoder 104 (an AND logic gate in this simple example) to provide a word line selection signal as output. In accordance with convention, a circle or bubble at the input to an AND logic gate indicate an inversion of the signal.

For lines WL[0], WL[1], WL[2] and WL[3], memory cell 106 stores a value that indicates if the corresponding row of the memory array has failed or not. A logical-1 stored value indicates that the corresponding word line is associated with a functioning row of the array. A logical-0 stored value indicates that the row has failed and been replaced by a spare row.

The signals on the word lines are provided by the outputs from the four AND logic gates 108. The inputs to each AND logic gate 104 are the word line selection signal, a clock signal (denoted as CLK) and a value stored in memory cells 106. The clock signal CLK is used to synchronize the outputs. Thus, when the output from the decoder is high and the stored value is one and clock signal CLK is high, the word line WL[n] for row n is driven high to select the corresponding row of the memory array.

In the example shown in FIG. 1, WL[1] and WL[2] will not be activated for any address, since the stored value in associated cell 106 is zero. Thus, rows 1 and 2 are marked for repair.

In the example shown, redundant word line RWL[0] is associated with failed row 1. The address of this row (01) is stored in repair address registers 110 for this word line. The stored address bits are compared in XNOR logic gates 112 and 114 with the incoming address bits A[1] and A[0]. If both address bits match the stored values, the output from AND logic gate 116 is driven high. If the output from AND logic gate 116 is high and a 'repair disable' bit stored in memory 118 is not set (i.e. a logical-0), and the clock signal CLK is high, the output from AND logic gate 120 will drive the word line RWL[0] high. Thus, the corresponding spare row will be used when the address matches the address stored in registers 110.

Similarly, redundant word line RWL[1] is associated with failed row 2. The address of this row (10) is stored in repair address registers 110 for this word line. The stored address bits are compared in XNOR logic gates 112 and 114 with the incoming address bits A[1] and A[0]. If both address bits match the stored values and a 'repair disable' bit stored in memory cells 114 is not set, the output from AND logic gate 120 will drive the word line RWL[1] high.

It will be apparent to those of ordinary skill in the art that circuit 100 can be extended for larger arrays by adding bits to the repair address registers 110 and a corresponding number of comparators (XNOR gates in the example embodiment).

In accordance with a feature of the present disclosure, the memory cells 106, repair address registers 110 and 'repair disable' memory cells 118 may be implemented using CES memory cells.

CES memory cells are born-on, corresponding to a logical-1 value. That is, after manufacture, the correlated electron material in the CES cell is in a low resistance/low impedance state. Therefore, before the array is tested for the first time, all rows are marked as not failed or 'Good' by memory cells 106. The repair disable cells 118 are also at logical-1 initially and thus the repair word lines are disabled.

A test procedure may be used to identify failed rows of the memory array and set the corresponding repair configuration data stored values in circuit 100.

Figure 2:
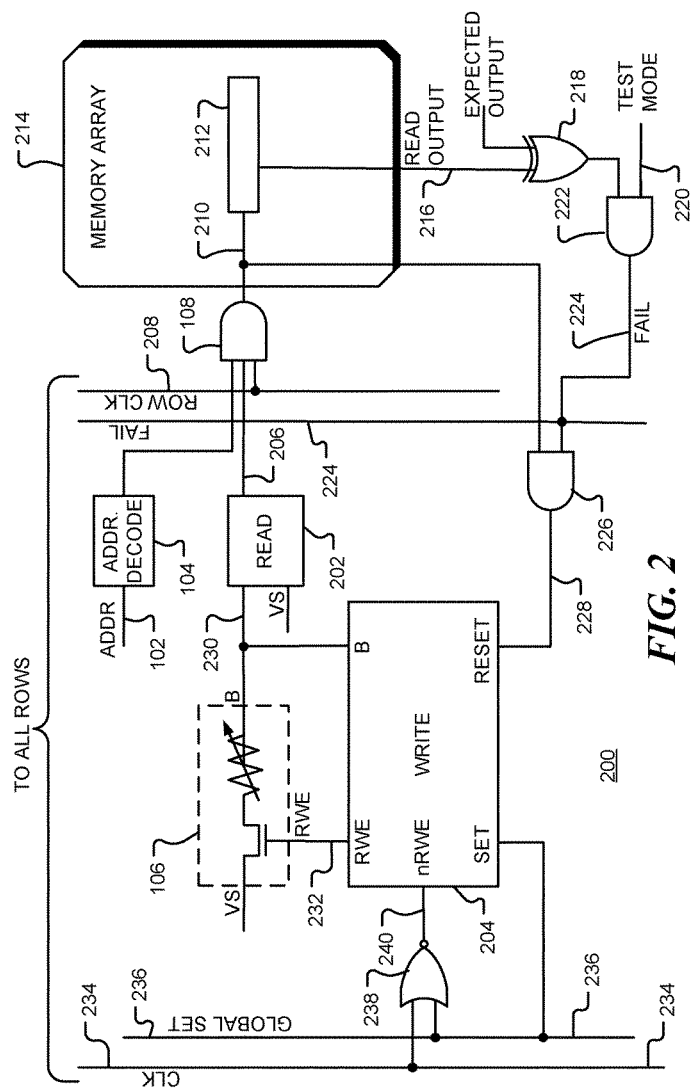
FIG. 2 is a diagrammatic representation of a circuit for Built-In Self-Repair (BISR) of a single row of a memory array, in accordance with embodiments of the disclosure.

FIG. 2 is a diagrammatic representation of a circuit 200 for Built-In Self-Repair (BISR) of a single row. The Built-In Self-Repair circuit 200 writes test data into an array row and then reads from that row, comparing the read data against the expected data.

The circuit includes address decoder 104, memory cell 106 and AND logic gate 108 for one row, as depicted in FIG. 1. Referring again to FIG. 2, memory cell 106 is read using read circuit 202. For the case of cell based on a correlated electron switch (CES), the read circuit detects if the memory cell is in a high or low resistance/impedance state by applying a potential across the cell between a bias node, denoted as 'B' and a ground or source node denoted as 'VS'. The read value 206 is passed to AND logic gate 108, together with row clock signal 208 and the output signal from address decoder 104. If all three signals input to the AND logic gate 108 as high, the word line 210 is selected to enable row 212 of memory array 214 to be read. The read output 216 is compared with the expected output in XOR gate 218. If the output of the XOR gate 218 is at logical-1 and the circuit is in a test mode, as indicated by test mode signal 220, AND gate 222 outputs a logical-1 on fail line 224. If this occurs during the Word-Line (WL) pulse on line 210, AND logic gate outputs a logical-1 to indicate that the bit in CES memory cell 106 is to be reset, i.e., programmed to logical-0. AND logic gate 226 receives fail line 224 and word line 210 and generates a logical-1 on RESET line 228 if the selected line is defective.

Programming of memory cell 106 is performed by write circuit 204. The cell is programmed by applying a bias voltage on line 230 to bias node B of the cell 106, while at the same time controlling the current through the cell by controlling the voltage on read/write enable (RWE) line 232. In this example, the RWE voltage is applied to the gate of a transistor in cell 106. Programming may be synchronized to a clock signal on line 232, denoted as 'CLK'.

Memory cell 106 may also be programmed to a logical-1 by asserting GLOBAL SET line 236. The GLOBAL SET and CLK signals are inputted to NOR logic gate 238 so that programming is enabled in response to either signal.

FIG. 2 shows a portion of the circuit corresponding to a single row of the memory array. Signals 224 (FAIL), 208 (ROW CLK), 236 (GLOBAL SET) and 234 (CLK) may be common to all rows.

The control logic that programs the failing address into the next available repair address register (110 in FIG. 1) and resets its 'repair disable' bit (in memory cell 118 in FIG. 1) is not shown in FIG. 2, but may be implemented similarly, using conventional logic gates.

All stored values (in cells 106, 110 and 118) can be set (i.e. programmed to logical-1) by asserting the GLOBAL SET signal on line 236, thereby restoring the repair configuration to its original state. One use of globally setting all repair configuration bits is in a search for memory rows containing weak bit cells. In this context, "weak" can be defined by the user, perhaps meaning cells that have less operating margin for one or more criteria, such as read timing margin or voltage margin, for example.

Both read and write accesses to cell 106 rely on current flow through the cell. The current flow is controlled by the voltage on read/write enable (RWE) line 232. To read cell 106, a bias voltage VREAD is applied on bias line 230 and the current is sensed by read circuit 202. To write a value to cell 106, the bias line is driven to a higher level and the current is controlled by the voltage applied at 232 to the gate of the transistor.

Figure 3:
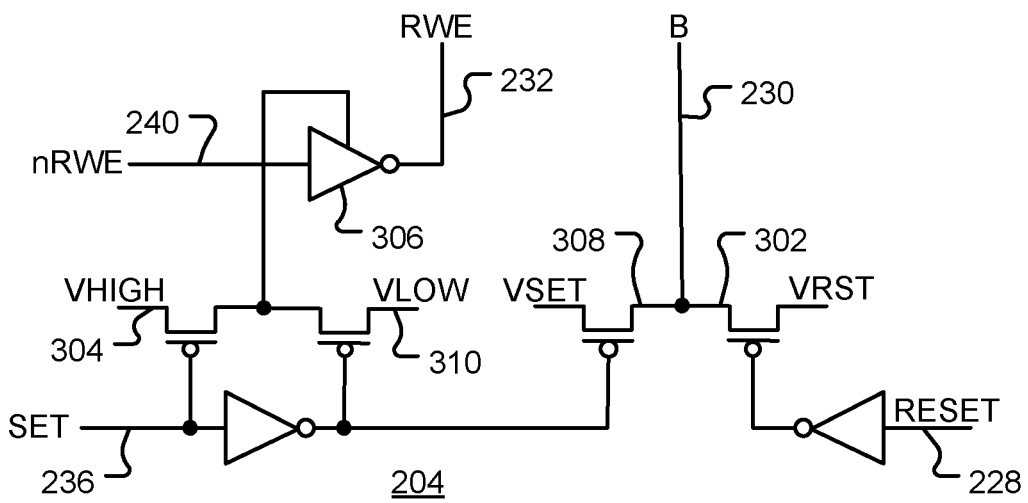
FIG. 3 shows a write circuit for a memory cell, in accordance with embodiments of the disclosure.

FIG. 3 shows a write circuit 204 for a memory cell in accordance with some embodiments. To reset the cell to a logical-0 (high resistance/impedance state) a high signal is provided on RESET line 228 is inverted and applied to the gate of transistor 302. This couples reset voltage (denoted as VRST) to bias line 230. SET signal on line 236, which is coupled to the gate of transistor 304, is low and turns the transistor ON. This sets the logical-1 reference value of inverter 306 to VHIGH. A clock pulse drives the signal on line 240 low, so the voltage VHIGH is provided on read/write enable (RWE) line 232. Thus, the bias voltage on line 230 is VRST and the voltage on RWE line 232 is VHIGH, which causes the cell 106 to be reset to logical-0.

Similarly, when the signal on RESET line 228 is low and the GLOBAL SET line 236 is high, line 240 is again low, but the bias voltage on line 230 is VSET, since transistor 308 is It will be apparent to those of ordinary skill in the art that the logic circuits may be constructed using various combinations of logic elements and utilizing positive or negative logic or a combination thereof.

The overhead for an array repair circuit can be calculated for arrays of various sizes, as shown in TABLE 2 below. The overhead is calculated as the percentage of redundancy control bits compared to the number of bits in the array, with an assumption that the control bits are the same size as the array bit cells. For example, in the case of 15 address bits, there will be 32,768 rows in the array, and the decoded redundancy bits will add 3.2% to 3.5% to the size of the array for a 32-bit word size (depending on the number of spare rows) and between 1.6% and 1.8% for a 64-bit word size. The last two columns in TABLE 2 show the overhead for a traditional redundancy scheme in which an encoded address is associated with each spare row. As expected, the overhead is less than 0.5% for all cases, but as described above, such a scheme requires routing of encoded (or partially-decoded) spare address information into the wordline decoder.

TABLE 2

| Row Address Bits | Rows | Spare Rows | Redundancy Control Bits | Bits Per Word | Redundancy Control Overhead (32-bit word) | Bits Per Word | Redundancy Control Overhead (64-bit word) | Encoded Redundancy. (Bits) | Encoded Redundancy Overhead (32-bit word) | Encoded Redundancy Overhead (64-bit word) |
|---|---|---|---|---|---|---|---|---|---|---|
| 8 | 256 | 8 | 328 | 32 | 4.0% | 64 | 2.0% | 64 | 0.78% | 0.39% |
| 8 | 256 | 16 | 400 | 32 | 4.9% | 64 | 2.4% | 128 | 1.56% | 0.78% |
| 8 | 256 | 32 | 544 | 32 | 6.6% | 64 | 3.3% | 256 | 3.13% | 1.56% |
| 10 | 1024 | 8 | 1112 | 32 | 3.4% | 64 | 1.7% | 80 | 0.24% | 0.12% |
| 10 | 1024 | 16 | 1200 | 32 | 3.7% | 64 | 1.8% | 160 | 0.49% | 0.24% |
| 10 | 1024 | 32 | 1376 | 32 | 4.2% | 64 | 2.1% | 320 | 0.98% | 0.49% |
| 10 | 1024 | 64 | 1728 | 32 | 5.3% | 64 | 2.6% | 640 | 1.95% | 0.98% |
| 12 | 4096 | 8 | 4200 | 32 | 3.2% | 64 | 1.6% | 96 | 0.07% | 0.04% |
| 12 | 4096 | 16 | 4304 | 32 | 3.3% | 64 | 1.6% | 192 | 0.15% | 0.07% |
| 12 | 4096 | 32 | 4512 | 32 | 3.4% | 64 | 1.7% | 384 | 0.29% | 0.15% |
| 12 | 4096 | 64 | 4928 | 32 | 3.8% | 64 | 1.9% | 768 | 0.59% | 0.29% |
| 12 | 4096 | 128 | 5760 | 32 | 4.4% | 64 | 2.2% | 1536 | 1.17% | 0.59% |
| 15 | 32768 | 32 | 33280 | 32 | 3.2% | 64 | 1.6% | 480 | 0.05% | 0.02% |
| 15 | 32768 | 64 | 33792 | 32 | 3.2% | 64 | 1.6% | 960 | 0.09% | 0.05% |
| 15 | 32768 | 128 | 34816 | 32 | 3.3% | 64 | 1.7% | 1920 | 0.18% | 0.09% |
| 15 | 32768 | 256 | 36864 | 32 | 3.5% | 64 | 1.8% | 3840 | 0.37% | 0.18% | turned ON. The voltage on RWE line 232 is VLOW since transistor 310 is turned ON. This causes the cell 106 to be set to logical-1.

Other write circuits will be apparent to those of ordinary skill in the art and are considered to be equivalent to the example circuit shown in FIG. 3 and described above.

An advantage of the memory array test and repair circuit, embodiments of which are discussed above, is that the repair configuration data are stored close to the address decode logic. Thus, no serial shift of repair configuration from remote memory is required, saving time and power during boot-up, and repair addresses do not need to be routed into the address decoder.

A further advantage is that the circuit is reconfigurable. Hard failures are repaired using spare rows but, in addition, other cells can also be repaired. For example, various margins for read, set, or reset may be optimized. Cells whose performance becomes marginal over time can be replaced, thereby extending the life of the memory array.

A still further advantage is that when non-volatile elements, such as CES cells, are used to store the repair configuration data, less power is used compared to the use of volatile memory, such as flip-flops, which requires maintenance of adequate retention voltage.

After all defective rows have been repaired, any additional spare rows may be used to optimize the operating margin of the memory array. In one embodiment, the test-and-repair sequence described above can initially be run using nominal read timing, and then again with progressively less timing margin, until a setting is found for which the number of rows to be repaired exceeds the number of spare rows available. The timing would then be backed off to the previous setting, for which test and repair operations will be run again, thereby ensuring correct operation of the array. The end result will be an array with read margin maximized.

Other array parameters may be optimized or adjusted. For example, if the array under test is itself an array of CES memory cells, then it may be advantageous to optimize set/reset/read voltage margins in addition to timing. For example, if the reset voltage VRST is 0.6V and the read voltage VREAD is 0.3V, there is a 0.3V difference between a reset operation and a read. However, these are nominal values, so in a manufactured array, there will be variation in actual voltages required for set/reset/read operations. One may wish to exclude cells from the array that can be reset between 0.5V and 0.59V, replacing them with cells that can only be reset in a narrower range, say, between 0.6V and 0.65V. The methodology for finding marginal cells (or more precisely, rows containing marginal cells) would be very similar to the approach for replacing the cells having the least timing margin. An operating condition with less voltage margin, less timing margin, or both is considered to be a more stringent operating condition. Other operating conditions that are more likely to result in failure of an array are also considered to be more stringent.

Figure 4:
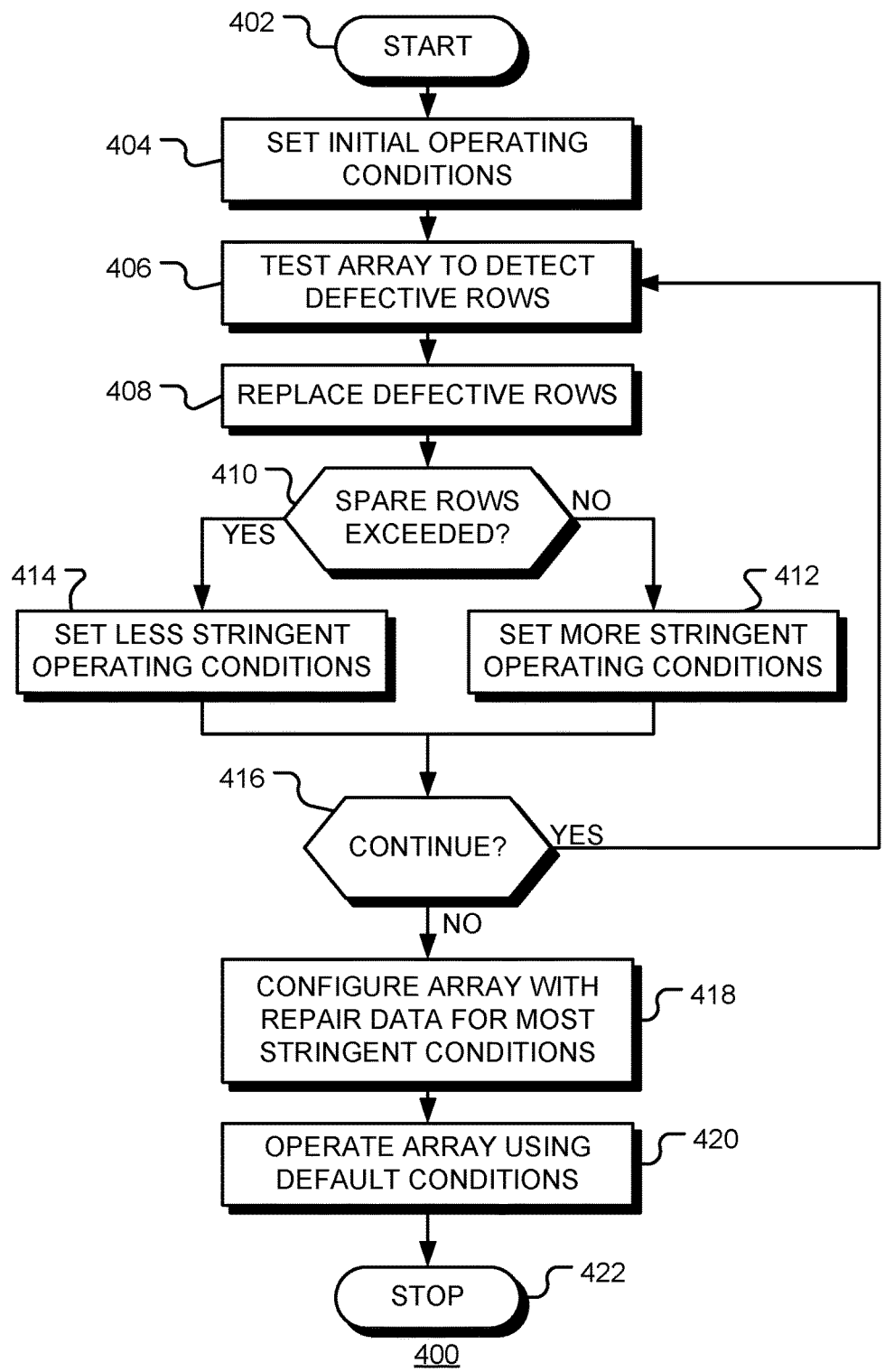
FIG. 4 is a flow chart of a method for array parameter selection, in accordance with embodiments of the disclosure.

FIG. 4 is a flow chart 400 of a method for configuring a memory array to provide improved operating margin, in accordance with embodiments of the disclosure. The method comprises testing the memory array under a plurality of operating conditions to identify defective rows of the memory array and determine associated repair configuration data, determining a most stringent operating condition for which sufficient spare rows are available to replace the defective rows, and configuring the memory array using repair configuration data associated with the most stringent operating condition for which sufficient spare rows are available to replace the defective rows. A predetermined set of operating conditions may be tested or, as shown in FIG. 4, an iterative search may be performed.

Following start block 402 in FIG. 4, initial operating conditions for the array are set at block 404. The operating conditions may include, for example, timing conditions, voltage conditions, temperature conditions, etc. At block 406, the memory array is tested to identify defective rows of the memory array and determine associated repair configuration data. Defective rows are replaced with spare rows at block 408. If a sufficient number of available spare rows are available, that is, the number of available spare rows is not exceeded, as depicted by the negative branch from decision block 410, testing of the memory array is repeated under a more stringent operating condition at block 412. However, if number of available spare rows is exceeded, as depicted by the positive branch from decision block 410, testing of the memory array is repeated under a less stringent operating condition at block 414. This process may be repeated for a number of iterations, as depicted by the positive branch from decision block 416. Upon completion, depicted by the negative branch from decision block 416, the memory array is configured at block 418 using array repair data associated with the most stringent for which sufficient spare rows were available. The array so configured, the array may then be operated using the default conditions at block 420. The default conditions are less stringent than those for which the array has been configured, hence the operating margin of the array has been increased. The method terminates at block 422.

Testing the memory array may include, for each row of the memory array, testing the row by comparing values read back from the memory array with expected values. When the row is defective and a spare row of the memory array is available, the row is replaced with a spare row of the memory array and repair configuration data stored in memory cells is updated.

Testing the row and replacing the row with a spare row of the memory array when the row is defective and a spare row of the memory array is available may be performed by an integrated self-repair circuit, as depicted in FIG. 2, for example.

Configuring the memory array using repair configuration data associated with the most stringent operating condition for which sufficient spare rows are available to replace the defective rows may comprise storing the repair configuration data in memory cells, such as correlated electron switches (CES's).

The method described above ensures that rows of the memory array having the least operating margin, that is, those that fail under the least stringent operating conditions, are replaced with spare rows.

The spare rows may be included in the array testing, so that spare rows with low operating margin are not used.

In accordance with embodiments of the disclosure, a method is provided for selecting one or more parameters for operation of a memory array. The method comprises setting new parameters and, for each row of the memory array, testing the row by comparing values read back from the array with expected values, replacing the row with a spare row of the array when the row is defective and a spare row of the array is available, and failing the array when the row is defective and no spare row of the array is available. If the array is not failed, the process may be iterated for one or more iterations or until parameters for operation are saved. Each iteration comprises saving the new parameters as previous parameters, setting new parameters and, for each row of the memory array, testing the row by comparing values read back from the array with expected values, replacing the row with a spare row of the array when the row is defective and a spare row of the array is available, and saving the previous parameters as the parameters for operation when the row is defective and no spare row of the array is available.

Testing the row and replacing the row with a spare row of the array when the row is defective and a spare row of the array is available may be performed by a built-in-test circuit.

Replacing the row with a spare row of the array when the row is defective and a spare row of the array is available may be performed by updating repair configuration data stored in memory cells. The memory cells together with an address decoder for accessing the memory array may be formed in a single integrated circuit.

Updating repair configuration data stored in memory cells may be performed by causing a state transition in correlated electron switch (CES).

Subsequent to saving the previous parameters as the parameters for operation, repair configuration data stored in the memory cells may be set to initial values and the array retested, using the saved previous parameters, to update the repair configuration data stored in the memory cells.

In accordance with some embodiments, the repair configuration data may be stored in a memory cells that uses a Correlated Electron Switch (CES). A CES cell uses a material such as a transition metal oxide (TMO) that exhibits an abrupt state transition from low resistance/impedance to high resistance/impedance. The TMO may be Nickel Oxide (NiO), for example. In contrast to other resistive memory devices, the state transition in a correlated electron material arises from electron correlations in the material, rather than from any solid state structural phase change. The transition may be controlled by a voltage and current applied across the material, as discussed above with reference to FIG. 3.

In the high resistance/impedance state, CES may have a resistance or the order of $10M\Omega$, for example. In the low resistance/impedance state, CES may have a resistance or the order of $100K\Omega$, for example. The capacitance also exhibits a transition from high to low, so a CES may be considered to be a variable impeder having both resistance and capacitance.

A CES is born in a low resistance/impedance state, that is, the doping of the transition-metal oxide (TMO) creates both electrons and holes. However, the doping is still p-type (defined by moving the Fermi level down in energy). The electrons are well screened in that there is no band-splitting, but are well above this new Fermi level. Therefore, the electrons do not contribute to transport. In the initial state, there is a large surplus of electrons in the correlated electron material which do not contribute to current. When bias is applied, hole injection occurs causing a hole current. When sufficient bias is applied (greater than the band-splitting potential) a Mott transition occurs. The transition occurs when the number of injected holes equals the number of electrons trapped in the system. The material in the CES changes from a metal state to the insulator state via the Mott transition. At this point, the electrons are no longer screened and become localized. This correlation splits the bands causing the material to have a very high resistance. In this state transport is still via holes. If enough bias is applied, electrons are injected. When enough electrons have been injected and enough potential is applied to overcome the set potential criteria, the increase in electrons screens the electrons and removes the localization, collapsing the band-splitting potential and forming a metal or low resistance/impedance material. The electrons injection into the system is controlled by the compliance of the system. The compliance therefore sets the number of electrons in the system that need to be "captured" by holes for the Mott transition to occur.

Correlated electron materials may be used in memory devices and switches. The resistance or impedance state of a CES may be used to designate a stored data value, which may be read in a variety of ways. Data may be written to a CES-based memory device using a variety of methods examples of which can be are described in co-owned U.S. patent application Ser. No. 14/826,064 Programmable Voltage For Correlated Electron Switch and/or co-owned U.S. patent application Ser. No. 14/826,091 Programmable Current For Correlated Electron Switch which are incorporated herein by reference.

State transitions in the material only occur when both voltage and current levels exceed certain thresholds. When the current threshold is not exceed the material, once placed into a high resistance/impedance state, remains in a high resistance/impedance state, even when subject to a high voltage electrostatic discharge, for example.

Some embodiments of the disclosure relate to an integrated circuit for self-repair of a memory array. The integrated circuit includes first word lines coupled to first memory rows of the memory array, one first word line for each bit of a line address word, second word lines coupled to one or more of second memory rows of the memory array and an address decoder circuit that is responsive to an address word. The address decoder, discussed above with reference to FIG. 1, is configured to generate a signal on a selected word line of the first and second word lines. Each first word line is associated with a first storage element that stores a repair value, and a first logic circuit configured to prevent or enable selection of the first word line dependent upon the stored repair value. Each second word line is associated with second storage elements used to store a line address of a first memory row to be repaired, a third storage element that stores a repair-enable value when a first memory row coupled to the second word line is to be used to repair a first memory row, and a second logic circuit responsive to the address word and configured to generate a signal on the second word line if the stored line address matches the address word and the stored repair-enable value indicates that the second memory row coupled to the second word line is to be used to repair a first memory row. The first, second and third storage elements, the first and second logic circuits, and the address decoder may be formed in a single integrated circuit.

One or more of the first, second and third storage elements may be a non-volatile memory such as a correlated electron switch (CES).

The integrated circuit may also include the memory array itself, and the memory array may be an array of correlated electron switch (CES) memory cells, for example.

Some embodiments of the disclosure relate to an integrated circuit for self-repair of a memory array that includes first word lines coupled to first memory rows of the memory array, one first word line for each bit of a line address word, second word lines coupled to one or more of second memory rows of the memory array, and an address decoder circuit responsive to an address word and configured to generate therefrom a signal on a selected word line of the first and second word lines. Each first word line is associated with a first storage element that stores a repair value and a first logic circuit configured to enable selection of the first word line when the stored repair value is set to a logical-1 value and further configured prevent selection of the first word line when the stored repair value is reset to a logical-0 value. The integrated circuit also includes compare logic configured to assert a reset signal when a value read from a row of the memory array couple to the first word line does not match an expected value and write logic configured to reset the repair value stored in the first storage element to a logical-0 value when the reset signal is asserted. The first storage elements, the first logic circuit, the address decoder, the compare logic and the write logic may be formed in a single integrated circuit.

The first logic circuit may include read logic configured to read a repair value stored in the first storage element.

One or more of the first storage elements may be a non-volatile memory such as a correlated electron switch (CES).

The integrated circuit may include the memory array itself, which may be an array of correlated electron switch (CES) memory cells, for example.

The write logic may be configured to set the repair value to a logical-1 in response to a GLOBAL SET signal.

The integrated circuits disclosed above may be defined be a set of instructions of a Hardware Description Language (HDL). The instructions may be stored in a non-transient computer readable medium. The instructions may be distributed via the computer readable medium or via other means such as a wired or wireless network. The instructions may be used to control manufacture or deign of the integrated circuit, and may be combined with other instructions.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and essence of the invention as defined by the appended claims.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So for example performing X includes any suitable method for causing another party such as a remote user, a remote processing resource (e.g., a server or cloud computer) or a machine to perform X. Similarly, performing elements X, Y, and Z may include any method of directing or controlling any combination of such other individuals or resources to perform element X, Y, and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some features of the disclosed embodiments are set out in the following numbered items:

1. A method for self-repair of a memory array comprising a plurality of first word lines each coupled to a corresponding row of a plurality of first memory rows and one or more second word lines each coupled to a corresponding row of one or more spare memory rows, the method comprising: identifying, from a received line address, an addressed word line of the plurality of first word lines; and selecting between the addresses word line and a second word line of the one or more second word lines dependent upon the received line address and dependent upon repair configuration data stored in a plurality of storage elements.

2. The method of item 1, where the plurality of storage elements comprises first storage elements associated the first word lines, second storage elements associated with the second word lines and third storage elements associated with the second word lines, and where selecting between the addresses word line and the second word line of the one or more second word lines comprises: asserting the addressed word line when a value stored in a first storage element, associated with the addressed word line, indicates that the corresponding first memory row is not repaired; and for each second line of the one or more second word lines: comparing the received line address to an address stored in second storage element associated the second word line; and asserting the second word line when the received line address is equal to the stored address and a value stored in a third storage element, associated with the second word line, indicates that the corresponding spare memory row is used for repair.

3. The method of item 2, further comprising: identifying a memory row of the plurality of first memory rows to be repaired; updating a first storage element associated with the identified memory row to indicate the identified memory row is repaired; storing a line address of identified memory row in a second storage element associated with a selected row of the one or more spare memory rows; and updating a third storage element associated with the selected row of the one or more spare memory rows to indicate the selected row is used for repair.

4. The method of item 1, further comprising: for each first row of the memory array: comparing values read back from the row with expected values; determining the row to be defective when the values read back from the row do not match the expected values; and when the row is defective and a spare row of the memory array is available, replacing the row with a spare row of the memory array and updating the repair configuration data stored in the plurality of storage elements.

5. The method of item 4, where the plurality of storage elements comprises a plurality of correlated electron switches and where updating the repair configuration data stored in the plurality of storage elements comprises causing state transitions in one or more of the correlated electron switches.

6. The method of item 4, further comprising successively making an operating condition of the memory array more stringent until no spare rows of the memory array are available.

7. The method of item 1, where selecting between the addresses word line and the second word line of the one or more second word lines dependent upon the received line address and dependent upon repair configuration data stored in a plurality of storage elements comprises: reading the configuration data from a plurality of correlated electron switches (CES); and providing the configuration data and received line address to a logic circuit, where the logic circuit is configured to drive the plurality of first word lines and the one or more second word lines.

8. An apparatus for selecting rows of a memory array, where the memory array comprises a plurality of first memory rows enabled by a plurality of first word lines and one or more spare memory rows enabled by one or more second word lines, the apparatus comprising:

address decode logic responsive to a line address and configured to select a first word line and to enable the selected first line when an associated first configuration bit indicates that the corresponding first memory row is functioning; and for each second word line of the one or more second word lines: address match logic configured to compare a stored address to the line address and to enable the second word line when the stored address matches the line address and an associated second configuration bit indicates that the corresponding spare memory row is in use to replace a first memory row corresponding to the stored line address.

9. The apparatus of item 8, where the first and second configuration bits are stored in non-volatile memory.

10. The apparatus of item 9, where the non-volatile memory, the address decode logic and the address match logic for each second word line are implemented in a single integrated circuit.

11. The apparatus of item 9, where the non-volatile memory comprises a correlated electron switch (CES) and a read circuit for the CES.

12. The apparatus of item 11, where the read circuit is configured to measure an impedance of the CES.

13. The apparatus of item 11, where the non-volatile memory further comprises a write circuit for the CES.

14. The apparatus of item 13, where the write circuit is configured to supply a selected voltage and current to the CES to cause a state transition in the CES.

15. The apparatus of item 8, further comprising built-in self-test logic configured to: compare values read back from a first memory row of the memory array at a first line address with expected values; determine the first memory row to be defective when the values read back from the row do not match the expected values; and when the first memory row is defective and a spare row of the memory array is available: replace the row with a spare row of the memory array; update the first configuration bit associated with the defective first row to indicate that the row is defective; update the second configuration bit associated with the spare row to indicate that the row is in use to replace the defective first memory row; and update the stored address to match the line address of the defective first memory row.

16. The apparatus of item 15, where the built-in self-test logic, the address decode logic and the address match logic for each second word line are implemented in a single integrated circuit.

17. The apparatus of item 15, where the first and second configuration bits and the stored address of the defective first memory row are stored in memory cells comprising correlated electron switches.

18. A non-transient computer readable medium containing instructions of a hardware description language defining the apparatus of item 8.

19. A memory system comprising: a memory array comprising a plurality of first memory rows enabled by a plurality of first word lines and one or more spare memory rows enabled by one or more second word lines; address decode logic responsive to a line address and configured to select a first word line and to enable the selected first line when an associated first configuration bit indicates that the associated first memory row is functioning; for each second word line of the one or more second word lines: address match logic configured to compare a stored address to the line address and enable the second word line when the stored address matches the line address and an associated second configuration bit indicates that the corresponding spare second memory row is in use to replace a first memory row corresponding to the stored line address; and built-in self-test logic configured to: compare values read back from a first memory row of the memory array at a first line address with expected values; determine the first memory row to be defective when the values read back from the row do not match the expected values; and when the first memory row is defective and a spare row of the memory array is available: replace the row with a spare row of the memory array; update the first configuration bit associated with the defective first row to indicate that the row is defective; update the second configuration bit associated with the spare row to indicate that the row is in use to replace the defective first memory row; and update the stored address to match the line address of the defective first memory row.

20. A non-transient computer readable medium containing instructions of a hardware description language defining the apparatus of item 19.

What is claimed is:

1. A method for self-repair of a memory array comprising a plurality of first word lines each coupled to a corresponding row of a plurality of first memory rows and one or more second word lines each coupled to a corresponding row of one or more spare memory rows, the method comprising:
    identifying, from a received line address, an addressed word line of the plurality of first word lines; and
    selecting between the addressed word line and a second word line of the one or more second word lines dependent upon the received line address and dependent upon repair configuration data stored in a plurality of storage elements.

2. The method of claim 1, where the plurality of storage elements comprises first storage elements associated the first word lines, second storage elements associated with the second word lines and third storage elements associated with the second word lines, and where selecting between the addresses word line and the second word line of the one or more second word lines comprises:
    asserting the addressed word line when a value stored in a first storage element, associated with the addressed word line, indicates that the corresponding first memory row is not repaired; and
    for each second line of the one or more second word lines:
        comparing the received line address to an address stored in second storage element associated the second word line; and
        asserting the second word line when the received line address is equal to the stored address and a value stored in a third storage element, associated with the second word line, indicates that the corresponding spare memory row is used for repair.

3. The method of claim 2, further comprising:
    identifying a memory row of the plurality of first memory rows to be repaired;
    updating a first storage element associated with the identified memory row to indicate the identified memory row is repaired;
    storing a line address of identified memory row in a second storage element associated with a selected row of the one or more spare memory rows; and
    updating a third storage element associated with the selected row of the one or more spare memory rows to indicate the selected row is used for repair.

4. The method of claim 1, further comprising:
    for each first row of the memory array:
        comparing values read back from the row with expected values;
        determining the row to be defective when the values read back from the row do not match the expected values; and
        when the row is defective and a spare row of the memory array is available, replacing the row with a spare row of the memory array and updating the repair configuration data stored in the plurality of storage elements.

5. The method of claim 4, where the plurality of storage elements comprises a plurality of correlated electron switches and where updating the repair configuration data stored in the plurality of storage elements comprises causing state transitions in one or more of the correlated electron switches.

6. The method of claim 4, further comprising successively making an operating condition of the memory array more stringent until no spare rows of the memory array are available.

7. The method of claim 1, where selecting between the addresses word line and the second word line of the one or more second word lines dependent upon the received line address and dependent upon repair configuration data stored in a plurality of storage elements comprises:
reading the configuration data from a plurality of correlated electron switches (CES); and
providing the configuration data and received line address to a logic circuit, where the logic circuit is configured to drive the plurality of first word lines and the one or more second word lines.

8. An apparatus for selecting rows of a memory array, where the memory array comprises a plurality of first memory rows enabled by a plurality of first word lines and one or more spare memory rows enabled by one or more second word lines, the apparatus comprising:
address decode logic responsive to a line address and configured to select a first word line and to enable the selected first world line when an associated first configuration bit indicates that the corresponding first memory row is functioning; and
for each second word line of the one or more second word lines:
address match logic configured to compare a stored address to the line address and to enable the second word line when the stored address matches the line address and an associated second configuration bit indicates that the corresponding spare memory row is in use to replace a first memory row corresponding to the stored line address.

9. The apparatus of claim 8, where the first and second configuration bits are stored in non-volatile memory.

10. The apparatus of claim 9, where the non-volatile memory, the address decode logic and the address match logic for each second word line are implemented in a single integrated circuit.

11. The apparatus of claim 9, where the non-volatile memory comprises a correlated electron switch (CES) and a read circuit for the CES.

12. The apparatus of claim 11, where the read circuit is configured to measure an impedance of the CES.

13. The apparatus of claim 11, where the non-volatile memory further comprises a write circuit for the CES.

14. The apparatus of claim 13, where the write circuit is configured to supply a selected voltage and current to the CES to cause a state transition in the CES.

15. The apparatus of claim 8, further comprising built-in self-test logic configured to:
compare values read back from a first memory row of the memory array at a first line address with expected values;
determine the first memory row to be defective when the values read back from the row do not match the expected values; and
when the first memory row is defective and a spare row of the memory array is available:
replace the row with a spare row of the memory array;
update the first configuration bit associated with the defective first row to indicate that the row is defective;
update the second configuration bit associated with the spare row to indicate that the row is in use to replace the defective first memory row; and
update the stored address to match the line address of the defective first memory row.

16. The apparatus of claim 15, where the built-in self-test logic, the address decode logic and the address match logic for each second word line are implemented in a single integrated circuit.

17. The apparatus of claim 15, where the first and second configuration bits and the stored address of the defective first memory row are stored in memory cells comprising correlated electron switches.

18. A non-transient computer readable medium containing instructions of a hardware description language defining the apparatus of claim 8.

19. A memory system comprising:
a memory array comprising a plurality of first memory rows enabled by a plurality of first word lines and one or more spare memory rows enabled by one or more second word lines;
address decode logic responsive to a line address and configured to select a first word line and to enable the selected first word line when an associated first configuration bit indicates that the associated first memory row is functioning;
for each second word line of the one or more second word lines:
address match logic configured to compare a stored address to the line address and enable the second word line when the stored address matches the line address and an associated second configuration bit indicates that the corresponding spare second memory row is in use to replace a first memory row corresponding to the stored line address; and
built-in self-test logic configured to:
compare values read back from a first memory row of the memory array at a first line address with expected values;
determine the first memory row to be defective when the values read back from the row do not match the expected values; and
when the first memory row is defective and a spare row of the memory array is available:
replace the row with a spare row of the memory array;
update the first configuration bit associated with the defective first row to indicate that the row is defective;
update the second configuration bit associated with the spare row to indicate that the row is in use to replace the defective first memory row; and
update the stored address to match the line address of the defective first memory row.

20. A non-transient computer readable medium containing instructions of a hardware description language defining the apparatus of claim 19.

* * * * *